(12) United States Patent
Miyamoto

(10) Patent No.: US 6,960,492 B1
(45) Date of Patent: Nov. 1, 2005

(54) SEMICONDUCTOR DEVICE HAVING MULTILAYER WIRING AND MANUFACTURING METHOD THEREFOR

(75) Inventor: Koji Miyamoto, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 5 days.

(21) Appl. No.: 10/401,870

(22) Filed: Mar. 31, 2003

(30) Foreign Application Priority Data

Jan. 30, 2003 (JP) .................................... 2003-022394

(51) Int. Cl.[7] .................. H01L 21/44; H01L 23/48
(52) U.S. Cl. .............. 438/109; 438/107; 257/777
(58) Field of Search .................... 438/107, 109, 438/612; 257/777, 785

(56) References Cited

U.S. PATENT DOCUMENTS

| | | | | |
|---|---|---|---|---|
| 4,612,083 A | * | 9/1986 | Yasumoto et al. | 438/59 |
| 4,818,728 A | * | 4/1989 | Rai et al. | 438/108 |
| 5,202,754 A | * | 4/1993 | Bertin et al. | 257/684 |
| 5,227,338 A | * | 7/1993 | Kryzaniwsky | 29/841 |
| 5,627,106 A | * | 5/1997 | Hsu | 438/459 |
| 5,977,640 A | * | 11/1999 | Bertin et al. | 257/777 |
| 6,054,363 A | | 4/2000 | Sakaguchi et al. | |
| 6,465,892 B1 | * | 10/2002 | Suga | 257/777 |
| 6,503,778 B1 | * | 1/2003 | Yamauchi et al. | 438/107 |
| 2002/0187625 A1 | * | 12/2002 | Shimooka et al. | 438/618 |

FOREIGN PATENT DOCUMENTS

| | | |
|---|---|---|
| JP | 4-134825 | 5/1992 |
| JP | 5-13410 | 1/1993 |
| JP | 2002-280448 | 9/2002 |
| JP | 2003-23071 | 1/2003 |

* cited by examiner

Primary Examiner—Matthew Smith
Assistant Examiner—Lex H. Malsawma
(74) Attorney, Agent, or Firm—Oblon, Spivak, McClelland, Maier & Neustadt, P.C.

(57) ABSTRACT

There is provided a method of manufacturing a semiconductor device having a number of wiring layers, comprising forming an underlayer, the underlayer including a substrate, at least one underlayer wiring layer provided on the substrate, and a first attachment surface, forming at least one upper structure, the upper structure including at least one upper wiring layer and a second attachment surface, and positioning the upper structure and the underlayer and attaching the first and second attachment surfaces to each other.

28 Claims, 9 Drawing Sheets

US 6,960,492 B1

SEMICONDUCTOR DEVICE HAVING MULTILAYER WIRING AND MANUFACTURING METHOD THEREFOR

CROSS-REFERENCE TO RELATED APPLICATIONS

This application is based upon and claims the benefit of priority from the prior Japanese Patent Application No. 2003-022394, filed Jan. 30, 2003, the entire contents of which are incorporated herein by reference.

BACKGROUND OF THE INVENTION

1. Field of the Invention

The present invention relates to a semiconductor device having multilayer wiring, formed by stacking a number of wiring layers, and a method for manufacturing the semiconductor device.

2. Description of the Related Art

Various semiconductor devices having multilayer wiring are now available. In accordance with the development of the Silicon-On-Chip (SOC) technique, system LSIs, for example, which have various IP (Intellectual Property) devices, such as a memory, logic, analog circuit, etc., mounted on a single chip, have become available. SOC devices, such as system LSIs incorporating several types of IP device, are manufactured by very time-consuming, complicated processes. In particular, SOC devices having more than ten wiring layers are manufactured by an extremely complicated process. However, SOC products generally have a short life cycle. Therefore, it is very important to shorten the turnaround time (TAT) of the development of SOC products.

In the case of, for example, LSIs, in which semiconductor elements such as transistors are formed on a semiconductor substrate, and wiring layers are sequentially deposited on the resultant structure, about twenty days are needed to manufacture, by way of trial, a half-finished product in which transistors and a first wiring layer are provided on a semiconductor substrate (hereinafter referred to as an "underlayer"). Further, about five days are needed to form one wiring layer. To form ten wiring layers, for example, on the above-mentioned underlayer, about fifty days are needed. Accordingly, about seventy days are required to form a complete product including an underlayer with ten wiring layers.

As described above, the conventional semiconductor device manufacturing process, in particular, the process of manufacturing multilayer SOC products, is very complicated, and hence a lot of time is needed to develop a trial product (LOT) and/or manufacture such devices. In addition, the life cycle of SOC products is short, as previously mentioned, which makes it impractical to develop trial products using much time.

BRIEF SUMMARY OF THE INVENTION

According to an aspect of the invention, there is provided a method of manufacturing a semiconductor device having a number of wiring layers, comprising: forming an underlayer, the underlayer including a substrate, at least one underlayer wiring layer provided on the substrate, and a first attachment surface; forming at least one upper structure, the upper structure including at least one upper wiring layer and a second attachment surface; and positioning the upper structure and the underlayer and attaching the first and second attachment surfaces to each other.

According to another aspect of the invention, there is provided a semiconductor device having a number of wiring layers, comprising: an underlayer including a substrate, at least one underlayer wiring layer provided on the substrate, and a first attachment surface; and at least one upper structure including at least one upper wiring layer and a second attachment surface attached to the first attachment surface.

DETAILED DESCRIPTION OF THE INVENTION

Figure 1:
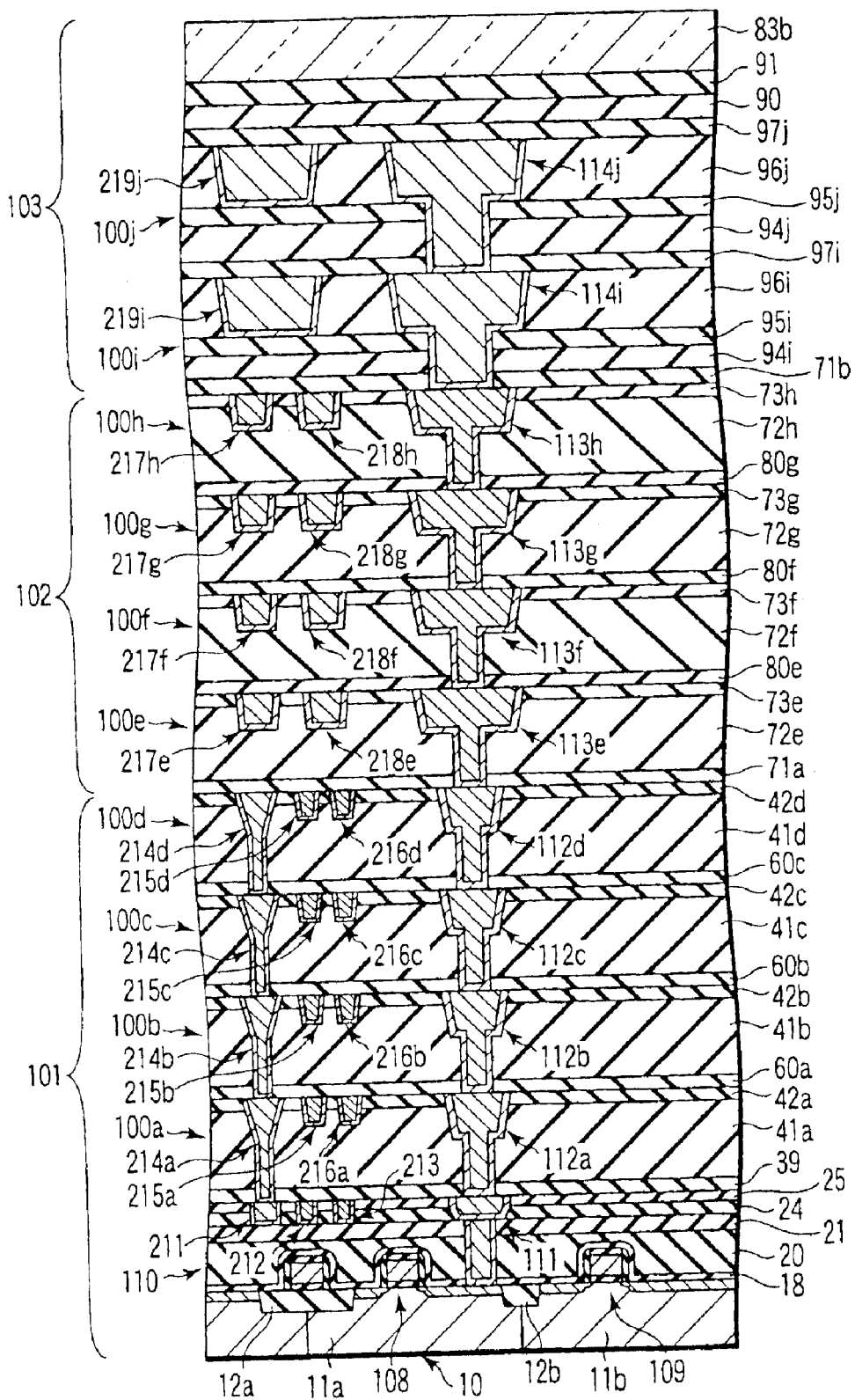
FIG. 1 is a sectional view illustrating the structure of a semiconductor device, according to an embodiment of the invention, obtained by attaching an upper structure having multilayer wiring to an underlayer including a semiconductor substrate.

Embodiments of the invention will be described with reference to the accompanying drawings. Each of the embodiments described below contains a plurality of wiring layers, which are similar to those of the other embodiments. In the drawings, the structural elements included in the wiring layers that have the same functions are denoted by the same reference numerals, but with different letter suffixes, such as 60a, 60b, 60c, . . . , as shown in FIG. 1, and no repeated explanation will be given of the same structural elements. Further, in the embodiments, copper-diffusion stopper layers are provided at necessary portions of wiring layers that are formed of copper. However, it is a matter of course that a similar function to that obtained from the above structure can be obtained, if wiring layers formed of a metal other than copper or formed of a material containing copper are provided, and if appropriate diffusion stopper layers are provided at necessary portions of these wiring layers.

FIG. 1 shows the sectional structure of the entire semiconductor device of the embodiment, in which eleven wiring layers that include five wiring layers forming an underlayer are provided on a predetermined semiconductor substrate 10.

As shown, the semiconductor device comprises: a first multilayer wiring region 101 formed of five wiring layers on the semiconductor substrate 10 and serving as the underlayer; a second multilayer wiring region 102 formed of four wiring layers on the region 101 and serving as the first upper structure; and a third multilayer wiring region 103 formed of two wiring layers on the region 102 and serving as the second upper structure.

The underlayer, i.e., the first multilayer wiring region 101, comprises the semiconductor substrate 10, MOS transistors 108 and 109 provided on the substrate 10, a first wiring layer 110 as an underlayer wiring layer, and second to fifth wiring layers 100a–100d as underlayer wiring layers, the first to fifth wiring layers being provided on the substrate 10 in this order.

The second multilayer wiring region 102 as the first upper structure comprises sixth to ninth wiring layers 100e–100h.

The third multilayer wiring region 103 as the second upper structure comprises tenth and eleventh wiring layers 100i and 100j, passivation films 90 and 91 and high-quality glass substrate 83b.

To provide the semiconductor device shown in FIG. 1, each of the first to third multilayer wiring regions 101–103 are formed separately. After that, the regions 101–103 are attached to each other, forming one body.

The sequential steps of forming the first multilayer wiring region 101 will be described.

Firstly, a P well 11a and N well 11b are formed in the semiconductor substrate 10. Element-isolating insulation films 12a and 12b for shallow trench isolation (STI), for example, are formed on the substrate 10 at the upper boundaries of the wells 11a and 11b, respectively.

First and second MOS transistors 108 and 109 are formed in the P and N wells 11a and 11b, respectively. After that, a thin insulation film 18 is formed on the substrate 10 having the first and second MOS transistors.

The first wiring layer 110 is formed on the insulation film 18. The first wiring layer 110 comprises an interlayer insulation film 20, interlayer barrier layer 21 (hereinafter referred to as an "etch stopper"), interlayer insulation film (low-k film) 24, etch stopper 25, and copper-diffusion stopper film 39, which are deposited in this order.

Further, in the first wiring layer 110, a first wiring section 111 having a contact 23, a wiring section 211 and independent wires 212 and 213 are formed in respective predetermined portions of the interlayer insulation film 24 and etch stopper 25. The lower end of the contact 22 of the first wiring section 111 extends through the insulation film 18 and reaches one 17c of the source/drain regions of the first MOS transistor 108, as is shown in FIG. 2C.

The second wiring layer 100a is formed on the first wiring layer 110. The second wiring layer 100a comprises an interlayer insulation film 41a, etch stopper 42a and copper-diffusion stopper film 60a formed on the copper-diffusion stopper film 39 in this order.

The second wiring layer 100a further comprises a second wiring section 112a, dependent wire 214a and independent wires 215a and 216a. The lower surface of the second wire 112a in the second wiring layer 100a is connected to the upper surface of the first wiring section 111 of the first wiring layer 110. Further, the dependent wire 214a is connected to the wiring section 211.

The third to fifth wiring layers 100b–100d provided on the second wiring layer 100a have the same structure as the second wiring layer 100a. More specifically, like the second wiring layer 100a, the third to fifth wiring layers 100b–100d have interlayer insulation films 41b –41d, etch stoppers 42b–42d, copper-diffusion stopper films 60b–60d, third- –fifth wiring sections 112b–112d, dependent wires 214b–214d and independent wires 215b–215d and 216b–216d, respectively.

The first to fifth wiring sections 111 and 112a –112d are sequentially stacked in this order so that they can be electrically connected to each other. The fifth wiring layer 100d has no copper-diffusion stopper film, unlike the other wiring layers below. The reason for it will be described later.

The uppermost layer of the first multilayer wiring region 101 shown in FIG. 1 is the etch stopper 42d. Further, the surface of the etch stopper 42d is formed such that the upper surfaces of the fifth wiring section 112d, dependent wire 214d and independent wires 215d and 216d are exposed therethrough.

If necessary, a passivation film (not shown) is formed on the uppermost etch stopper 42d for protecting the interior of the first multilayer wiring region 101 as the underlayer from various mechanical, chemical damages. The passivation film is removed, as described later, when the first multilayer wiring region 101 as the underlayer and the second multilayer wiring region 102 are attached to each other, forming one body. This is because it is necessary to expose the upper surface of the fifth wiring section 112d and polish it to a mirror finish, in order to connect the fifth wiring section 112d to a sixth wiring section 113e formed in the sixth wiring layer 100e.

On the other hand, in this embodiment, the lower surface of the sixth wiring layer 100e is not covered with a passivation film, but with high quality glass substrate. This glass substrate is also removed before the first and second regions 101 and 102 are attached. The reason for this will also be described later.

The upper surface of the fifth wiring section 112d is polished to a mirror finish by, for example, CMP, thereby forming an attachment surface. The thus-polished upper surface of the first multilayer wiring region 101 is pressed against the similarly formed attachment surface of the second multilayer wiring region 102, whereby the regions 101 and 102 are attached to each other, without using any adhesive. The principle of this attaching phenomenon is well-known so that a further explanation is omitted here.

The second multilayer wiring region 102, and the first multilayer wiring region 101 whose upper surface is attached to the former, are formed separately. The structure of the second multilayer wiring region 102 will now be described.

The sixth wiring layer 100e of the second multilayer wiring region 102 is formed by sequentially depositing, on a high quality glass substrate, an etch stopper 71a, interlayer insulation film 72e, etch stopper 73e and copper-diffusion stopper film 80e in this order, as will be described in detail later. The sixth wiring layer 100e further comprises a sixth wiring section 113e and independent wiring sections 217e and 218e.

When the first and second multilayer wiring regions 101 and 102 are attached to each other, the bottom surface of the sixth wiring section 113e of the sixth wiring layer 100e is connected to the upper surface of the fifth wiring section 112d of the fifth wiring layer 100d.

The second multilayer wiring region 102 further comprises seventh to ninth wiring layers 100f–100h sequentially deposited on the sixth wiring layer 100e. The seventh to ninth wiring layers 100f–100h have the same structure as the sixth wiring layer 100e, and comprise interlayer insulation films 72f–72h, etch stoppers 73f–73h, copper-diffusion stopper films 80f–80h, seventh to ninth wiring sections 113f–113h and independent wiring sections 217f–217h and 218f–218h, respectively. The sixth wiring section 113e to ninth wiring section 113h are connected. Like the wiring layer 100d, the ninth wiring layer 100h has no copper-diffusion stopper film.

Thus, the uppermost layer of the second multilayer wiring region 102 shown in FIG. 1 is the etch stopper 73h. The ninth wiring section 113h and independent wiring sections 217h and 218h are formed in the uppermost wiring layer 100h of the second multilayer wiring region 102, such that they are exposed through the etch stopper 73h.

If necessary, a passivation film (not shown) is formed on the uppermost etch stopper 73h for protecting the surface of the wiring layer 100h until the attachment work is started. In the structure shown in FIG. 1, however, this passivation is removed since the attachment work has already been performed. Thus, when the second multilayer wiring region 102 is attached to the third multilayer wiring region 103 formed separately, it is necessary to remove the passivation film, and to expose the upper surface of the ninth wiring section 113h so that the section 113h can be connected to a tenth wiring section 114i formed in the tenth wiring layer 100i.

In this embodiment, a protection film of high quality glass is used instead of a passivation film, as will be described in detail later. The third multilayer wiring region 103 is attached, by pressing, to the upper surface of the second multilayer wiring region 102 via mirror-finished attachment surfaces.

The structure of the third multilayer wiring region 103 will be described in detail.

The tenth wiring layer 100i of the third multilayer wiring region 103 is formed by sequentially depositing an etch stopper 71b, interlayer insulation film 94i, etch stopper 95i, interlayer insulation film 96i and copper-diffusion stopper film 97i in this order. The tenth wiring layer 10i further comprises the tenth wiring section 114i and an independent wiring section 219i formed at predetermined positions. The bottom surface of the tenth wiring section 114i in the tenth wiring layer 110i is exposed through the bottom surface of the etch stopper 71b, and connected to the upper surface of the ninth wire 113h of the ninth wiring layer 100h.

The third multilayer wiring region 103 also comprises an eleventh wiring layer 100j stacked on the tenth wiring layer 100i. The eleventh wiring layer 100j has a structure similar to that of the tenth wiring layer 100i, and comprises an interlayer insulation film 94j, etch stopper 95j, interlayer insulation film 96j, copper-diffusion stopper film 97j, eleventh wiring section 114j and independent wiring section 219j. The upper surface of the tenth wiring section 114i is connected to the bottom surface of the eleventh wiring section 114j.

Passivation films 90 and 91 and high quality glass substrate 83b are sequentially formed on the upper surface of the copper-diffusion stopper film 97j of the eleventh wiring section 100j of the third multilayer wiring region 103.

As described above, the first multilayer wiring region 101 as the underlayer, the second multilayer wiring region 102 as the first upper structure, and the third multilayer wiring region 103 as the second upper structure are formed individually. The semiconductor device of a multilayer wiring structure, which has the semiconductor substrate 10 and eleven wiring layers 110 and 100a–100j as shown in FIG. 1, can be easily obtained simply by pressing, against each other, the mirror-finished attachment surfaces of the first to third multilayer wiring regions 101, 102 and 103.

Thus, the source/drain region 17c of the transistor 108 is connected to all of the first to eleventh wiring regions 111, 112a–112d, 113e–113h, 114i, and 114j of the first to third multilayer wiring regions 101–103.

Referring now to FIGS. 2A–3B, a detailed description will be given of the process of manufacturing the first multilayer wiring region 101 as the underlayer of the semiconductor device shown in FIG. 1.

Figure 2A:
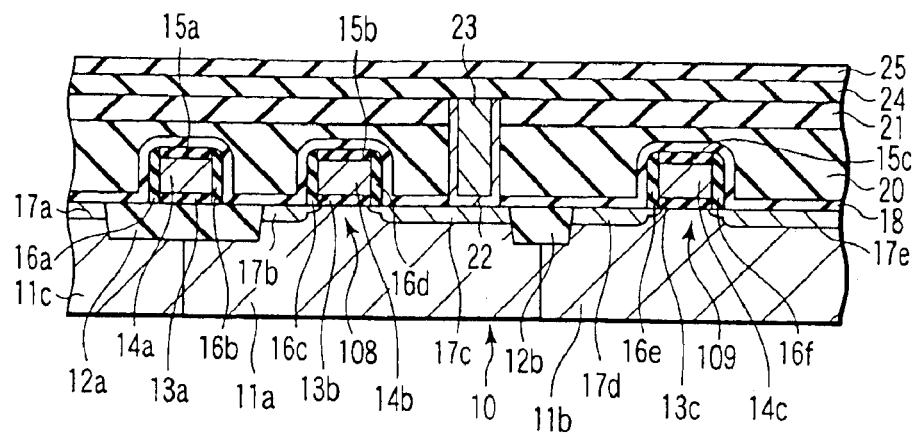
FIG. 2A is a sectional view useful in explaining a manufacturing step of a first multilayer wiring region as the underlayer of the semiconductor device of FIG. 1.

Firstly, as shown in FIG. 2A, the P well 11a and N wells 11b and 11c are formed on the semiconductor substrate 10. The element-isolating insulation films 12a and 12b are formed at the boundary portions between different conductivity type wells on the semiconductor substrate 10, i.e., between the wells 11a and 11b, and between the wells 11a and 11c.

A gate oxide film 13b, gate electrode 14b and insulation layer 15b are sequentially formed on the P well 11a between the element-isolating insulation films 12a and 12b. In this state, lightly doped drain (LDD) regions for source/drain regions are formed in the surface of the semiconductor substrate 10 adjacent to the gate oxide film 13b by, for example, ion implantation, using the insulation layer 15b as a mask.

After forming the LDD regions, gate sidewall insulation films 16c and 16d are formed at the opposite ends of the gate oxide film 13b, gate electrode 14b and insulation layer 15b. Subsequently, source/drain regions 17b and 17c are formed by, for example, ion implantation, using the gate sidewall insulation films 16c and 16d as masks.

As a result, the MOS transistor 108 is formed on the P well 11a.

Similarly, the MOS transistor 109 is formed on the N well 11b isolated by the element-isolating insulation film 12b. Like the MOS transistor 108, the MOS transistor 109 comprises a gate oxide film 13c, gate electrode 14c, insulation layer 15c, gate sidewall insulation films 16e and 16f, and source/drain regions 17d and 17e having LDD regions.

Further, an electrode structure similar to the MOS transistor 108 is formed on the element-isolating insulation film 12a, the electrode structure having a gate oxide film 13a, gate electrode 14a, insulation layer 15a, gate sidewall insulation films 16a and 16b. Since this electrode structure is formed on the element-isolating insulation film 12a, no source/drain regions are formed. In other words, the gate electrode 14a on the element-isolating insulation film 12a is used as, for example, a wire. The source/drain region 17a formed in the N well 11c indicates one of the source and drain regions of a MOS transistor (not shown).

After that, the thin gate insulation film 18 is formed on the entire surface of the semiconductor substrate 10 that includes the MOS transistors 108 and 109. Further, the interlayer insulation film 20 and copper-diffusion stopper film 21 are formed on the entire gate insulation film 18.

In this state, the interlayer insulation film 20 and copper-diffusion stopper film 21 are etched to form a metal barrier layer 22 and contact 23 on the source/drain region 17c of the most transistor 108. Thereafter, the metal barrier layer 22 and contact 23 are formed by, for example, the single damascene method. After forming the metal barrier layer 22 and contact 23, the diffusion stopper film 21 is polished by CMP, thereby making the diffusion stopper film 21 level with the metal barrier layer 22 and contact 23.

Furthermore, the interlayer insulation film (low-k film) 24 and etch stopper 25 are sequentially deposited on the diffusion stopper film 21. This state is shown in FIG. 2A.

Figure 2B:
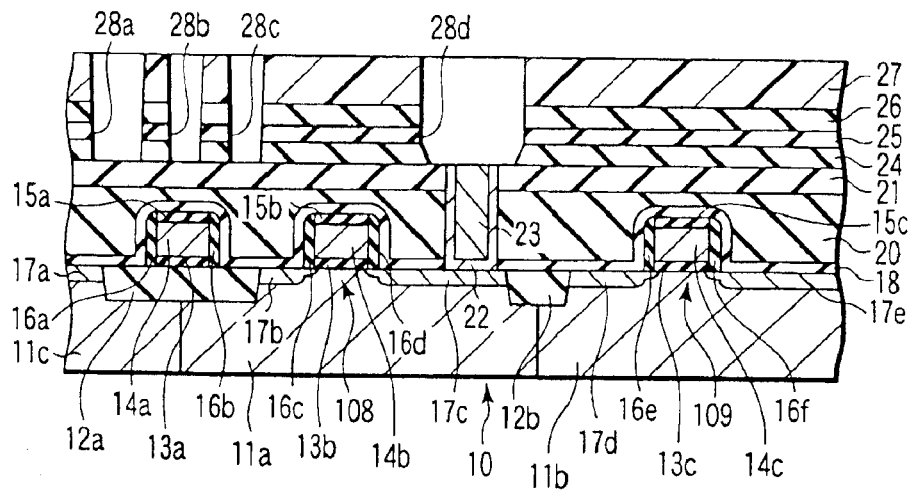
FIG. 2B is a sectional view useful in explaining a manufacturing step of the first multilayer wiring region next to the step of FIG. 2A.
Figure 2C:
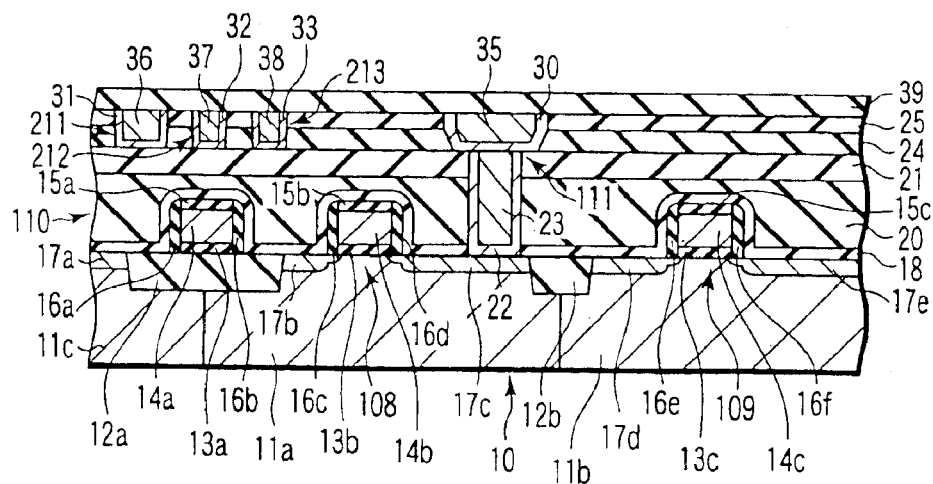
FIG. 2C is a sectional view useful in explaining a manufacturing step of the first multilayer wiring region next to the step of FIG. 2B.

Subsequently, as shown in FIG. 2B, an insulation film 26 is deposited on the etch stopper 25, and a resist film 27 is formed on the insulation film 26. The resist film 27 is patterned by standard photolithography. After that, using the patterned resist film 27 as an etching mask, selected portions of the interlayer insulation film 24, etch stopper 25 and insulation film 26 are etched, thereby forming wiring trenches 28a, 28b, 28c and 28d that reach the diffusion stopper film 21.

As a result, the upper surface of the contact 23 is exposed through the wiring groove or trench 28d. The wiring trenches 28a–28c are formed, for example, above the element-isolating insulation film 12a on which the MOS transistors 108 and 109 are not formed. After forming the wiring trenches 28a–28d, the resist film 27 and insulation film 26 are removed.

Referring to FIG. 2C, a metal barrier layer 30 is formed on the surface of the wiring trench 28d, and a metal layer is deposited on the metal barrier layer 30, thereby forming a first wire 35. At the same time, metal barrier layers 31, 32 and 33 and wires 36, 27 and 38 are formed in the wiring trenches 28a, 28b and 28c, respectively.

The metal barrier layer 22, contact 23, metal barrier layer 30 and first wire 35 form the first wiring section 111. Similarly, the metal barrier layer 31 and wire 36 form the wiring section 211, the metal barrier layer 32 and wire 37 form the independent wiring section 212, and the metal barrier layer 33 and wire 38 form the independent wiring section 213.

The copper-diffusion stopper film 39 is formed on the upper surfaces of the etch stopper 25, first wiring section 111, wiring section 211 and independent wiring sections 212 and 213. The resultant structure is the first wiring layer 110 of the underlayer 101.

Figure 3A:
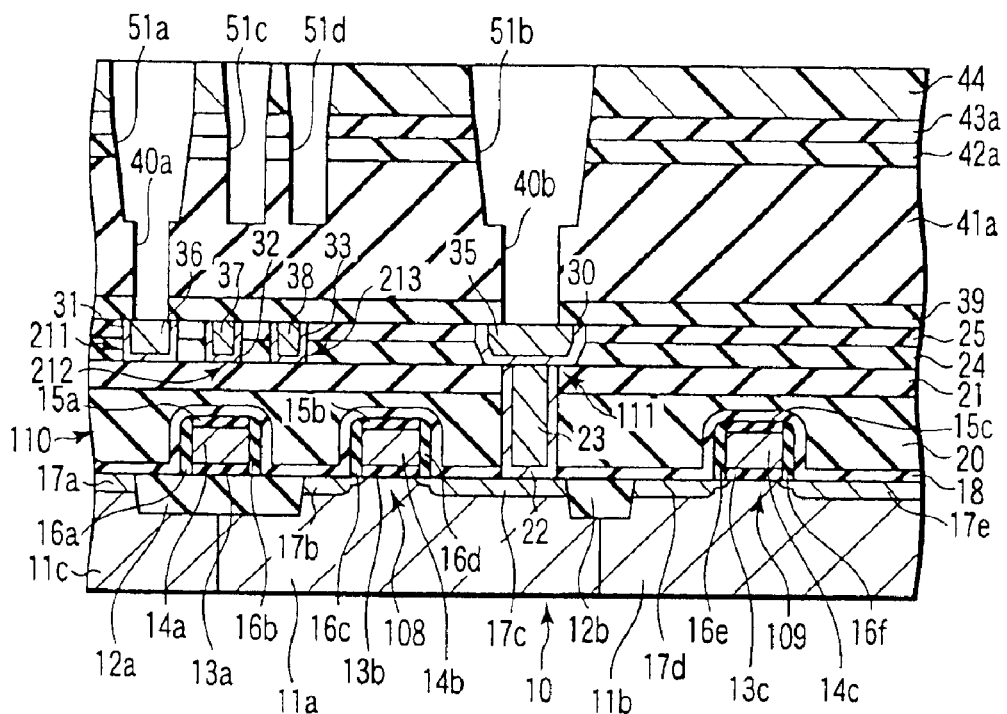
FIG. 3A is a sectional view useful in explaining a manufacturing step of the first multilayer wiring region next to the step of FIG. 2C.

Referring to FIG. 3A, the aforementioned interlayer insulation film 41a and etch stopper 42a and an insulation film 43a are sequentially formed on the interlayer insulation film 39. Furthermore, a resist film 44 of a predetermined first pattern is deposited for the dual damascene method. Using the resist film 44 of the first pattern as an etching mask, the interlayer insulation film 41a, etch stopper 42a and insulation film 43a are etched, thereby forming via holes 40a and 40b at predetermined portions of the films. The via holes 40a and 40b are provided on the wiring section 211 and first wiring section 111, respectively.

To form predetermined wiring grooves or trenches 51a–51d, the resist film 44 is patterned into the second pattern as shown in FIG. 3A. Using the resist film 44 of the second pattern as the etching mask, etching is performed again, thereby forming a wiring trench 51a continuous with the via hole 40a and a wiring trench 51b continuous with the via hole 40b, and wiring trenches 51c and 51d adjacent to the wiring trench 51a. After forming these wiring trenches, the resist film 44 and insulation film 43a are removed.

Figure 3B:
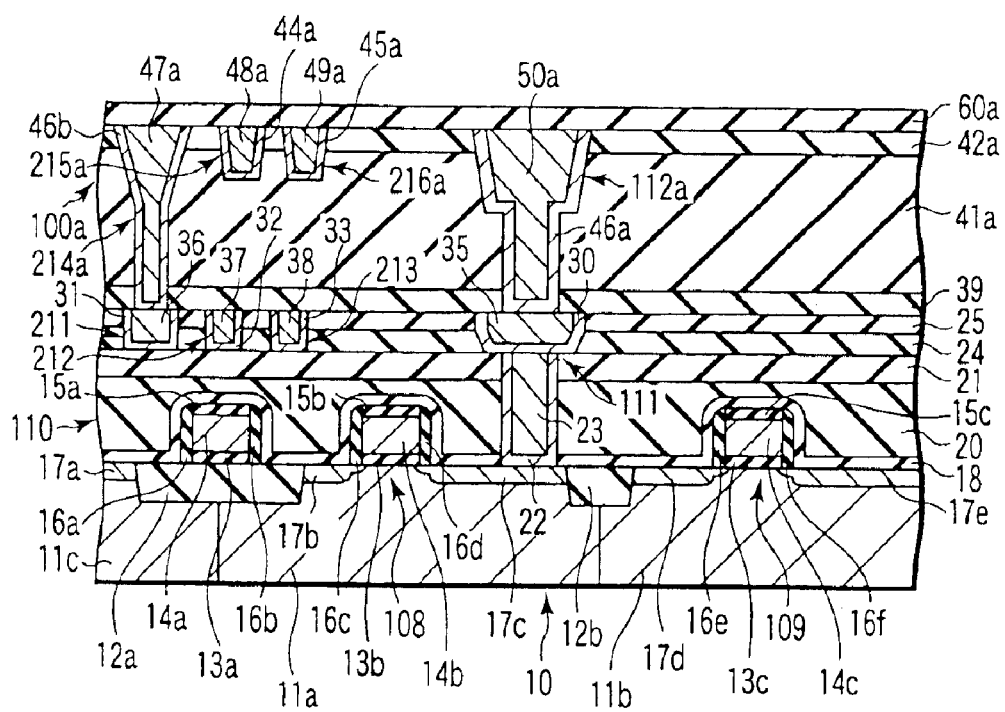
FIG. 3B is a sectional view useful in explaining a manufacturing step of the first multilayer wiring region next to the step of FIG. 3A.

Referring to FIG. 3B, a barrier layer 46a is formed on the surfaces of the via hole 40b and wiring trench 51b, and a conductor such as copper is deposited on the barrier layer 46a, thereby forming a second wire 50a. Similarly, a barrier layer 46b and wire 47a are formed on the surfaces of the via hole 40a and wiring trench 51a. Further, metal barrier layers 44a and 45a and wires 48a and 49a are formed in the wiring trenches 51c and 51d, respectively.

The metal barrier layer 46b and wire 47a form the dependent wiring section 214a, and the metal barrier layer 46a and second wire 50a form the second wiring section 112a. The metal barrier layer 44a and wire 48a form the independent wiring section 215a, and the metal barrier layer 45a and wire 49a form the independent wiring section 216a. Thus, the dependent wiring section 214a and second wiring section 112a are formed by, for example, the dual damascene method.

The thus-formed dependent wiring section 214a and independent wiring section 216a are connected to the wiring section 211 and first wiring section 111, respectively.

The etch stopper 42a, dependent wiring section 214a, independent wiring sections 215a and 216a and second wiring section 112a are flattened by CMP. The copper-diffusion stopper film 60a is formed on the flattened surface. As a result, the second wiring layer 100a as shown in FIG. 3B is obtained.

As described above referring to FIG. 1, the first multilayer wiring region 101 as the underlayer comprises the first to fifth wiring layers 110 and 100a–100d sequentially formed on the semiconductor substrate 10. The third to fifth wiring layers 100b–100d have the same structure as the second wiring layer 100a, and respectively comprise: interlayer insulation films 41b–41d; etch stoppers 42b–42d, copper-diffusion stopper films 60b–60d, the dependent wiring sections 214b–214d having metal barrier layers 43b–43d and dependent wires 47b–47d; the independent wiring sections 215b–215d having metal barrier layers 44b–44d and wires 48b–48d; the independent wiring sections 216b–216d having metal barrier layers 45b–45d and wires 49b–49d; and the third to fifth wiring sections 112b–112d having metal barrier layers 46b–46d and third to fifth wires 50b–50d.

The aforementioned copper-diffusion stopper film is not formed on the upper surface of the first multilayer wiring region 101 provided on the semiconductor substrate 10. Instead, a high quality glass substrate (not shown) is provided on the upper surfaces of the etch stopper 42d, dependent wiring section 214d, independent wiring sections 215d and 216d and fifth wiring section 112d, which are uppermost layers of the first multilayer wiring region 101. This high quality glass substrate is provided, if necessary, to secure the mechanical strength of the first multilayer wiring region 101 until the region 101 is attached to the second multilayer wiring region 102. Further, the first to fifth wiring sections 111 and 112a–112d are vertically linearly arranged on the source/drain region 17c of the transistor 108 so that they are connected to each other.

The high quality glass substrate is formed of SiN, SiC, etc. The manner of providing a high quality glass substrate on the first multilayer wiring region 101 is well known, therefore is not described.

The gate oxide films 13a–13c are formed of, for example, $SiO_2$, while the gate electrodes 14a–14c are formed of, for example, poly-silicon.

As described above, in the embodiment shown in FIG. 1, the first multilayer wiring region 101 on the semiconductor substrate 10 comprises the five wiring layers 110 and 100a–100d. In a particular IP (Intellectual Property) device, such as a DRAM, three or four wiring layers are used in a memory core. In this case, it is considered to be proper to sequentially deposit three or four wiring layers on a substrate to form the memory core, instead of attaching the layers to each other. However, if a larger number of wiring layers than three or four are used to form a semiconductor device other than the memory core, the attachment method according to this embodiment may be preferable.

Since the embodiment employs eleven wiring layers in total, the six wiring layers, other than the five wiring layers used as underlayer wiring layers, are grouped into two multilayer wiring regions, i.e., the first upper structure of four layers and second upper structure of two layers, and are attached to the underlayer region.

Figure 4:
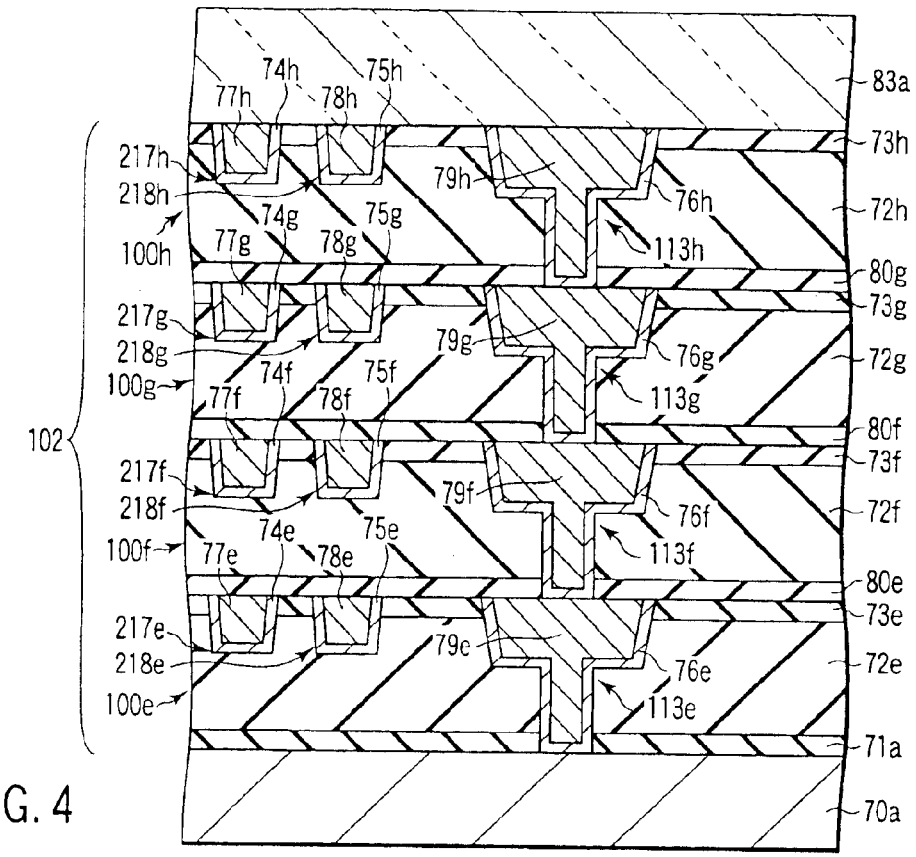
FIG. 4 is a sectional view useful in explaining the process of forming a second multilayer wiring region on a silicon substrate, this region being prepared separately from the underlayer and first multilayer wiring region of the semiconductor device shown in FIG. 1.

Referring to FIG. 4, a description will be given of the second multilayer wiring region 102 as the first upper structure, which is to be attached to the upper surface of the first multilayer wiring region 101 as shown in FIG. 1. In FIG. 4, the second multilayer wiring region 102 is formed on a silicon substrate different from the substrate 10.

As seen from FIG. 4, a sixth wiring layer 100e is formed on a silicon substrate 70a as a semiconductor substrate prepared in addition to the silicon substrate 10 of FIG. 1. The layer 100e comprises an etch stopper 71a, interlayer insulation film 72e, etch stopper 73e and copper-diffusion stopper film 80e.

The sixth wiring layer 100e further comprises a sixth wiring section 113e having a metal barrier layer 76e and sixth wire 79e, an independent wiring section 217e having a metal barrier layer 74e and wire 77e, and an independent wiring section 218e having a metal barrier layer 75e and wire 78e, these sections being formed at predetermined positions. Like the wiring section 112a, the sixth wiring section 113e can be formed by depositing copper in a wiring trench that is formed by the dual damascene method. Further, the independent wiring sections 217e and 218e can be formed by depositing copper in a wiring trench that is formed by the single damascene method.

A positioning mark (not shown) is beforehand provided on the silicon substrate 70a, and is used in a later process for attaching the first multilayer wiring region 101 to the second multilayer wiring region 102, in order to accurately connect the sixth wiring section 113e to the fifth wiring section 113d of the multilayer wiring region 101.

The second multilayer wiring region 102 has four wiring layers, i.e., the seventh to ninth wiring layers 100f–100h sequentially formed on the sixth wiring layer 100e. The seventh to ninth wiring layers 100f–100h have the same structure as the sixth wiring layer 100e, and respectively comprise: interlayer insulation films 72f–72h; etch stoppers 73f–73h; copper-diffusion stopper films 80f and 80g; the independent wiring sections 217f–217h having metal barrier layers 74f–74h, wires 77f–77h; the independent wiring sections 218f–218h having the metal barrier layers 75f–75h and wires 78f–78h; and the seventh to ninth wiring sections 113f–113h having metal barrier layers 76f–76h and seventh to ninth wires 79f–79h.

A copper-diffusion stopper film similar to that provided on each of the other wiring layers 100e–100g is not formed on the upper surface of the ninth wiring layer 100h. Instead, high quality glass substrate 83a is provided on the upper surfaces, flattened by CMP, of the etch stopper 73h as the uppermost portion of the second multilayer wiring region 102, and the independent wiring sections 217h and 218h and ninth wiring section 113h which are exposed in the same plane as the etch stopper 73h. The high quality glass substrate 83a is provided to secure the mechanical strength of the second multilayer wiring region 102 until the region 102 is attached to the third multilayer wiring region 103. Further, the sixth to ninth wiring sections 113e–113h are vertically linearly arranged on the substrate 70a so that they are connected to each other.

The second multilayer wiring region 102 and high quality glass substrate 83a on the silicon substrate 70a shown in FIG. 4 can be manufactured by known techniques, therefore are not described.

Figure 5:
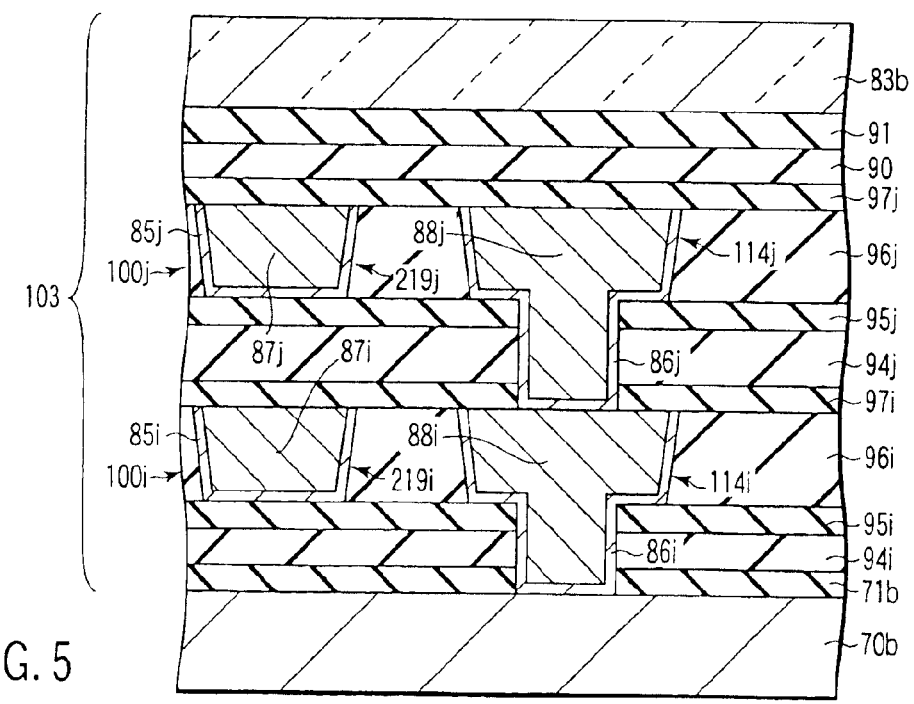
FIG. 5 is a sectional view useful in explaining the process of forming a third multilayer wiring region on a silicon substrate, this region being prepared separately from the underlayer and second multilayer wiring region of the semiconductor device shown in FIG. 1.

Referring to FIG. 5, a description will be given of the multilayer wiring structure provided on the silicon substrate 70b as the third multilayer wiring region 103 shown in FIG. 1.

As shown in FIG. 5, the tenth wiring layer 100i is formed on a silicon substrate 70b prepared in addition to the substrate 10 and substrate 70a. The tenth wiring layer 100i comprises an etch stopper 71b, interlayer insulation film 94i, etch stopper 95i, interlayer insulation film 96i and copper-diffusion stopper film 97i formed in this order. The tenth wiring layer 100i further comprises the tenth wiring section 114i having a metal barrier layer 86i and tenth wire 88i, and the independent wiring section 219i having a metal barrier layer 85i and wire 87i, these wiring sections being formed at predetermined positions.

Like the wiring section 112a, the tenth wiring section 114i can be formed by depositing copper in a wiring trench formed by the dual damascene method. The independent wiring section 87i can be formed by depositing copper in a wiring trench formed by the single damascene method.

Like the silicon substrate 70a in FIG. 4, the silicon substrate 70b has, for example, a positioning mark (not shown) formed thereon. This mark is used in a later process for attaching the third multilayer wiring region 103 to the second multilayer wiring region 102, in order to accurately connect the tenth wiring section 114i to the ninth wiring section 11h of the second multilayer wiring region 102.

The third multilayer wiring region 103 also has the eleventh wiring layer 100j formed on the tenth wiring layer 100i. The eleventh wiring layer 100j has a structure similar to that of the tenth wiring layer 100i, and comprises an interlayer insulation film 94j, etch stopper 95j, interlayer insulation film 96j, copper-diffusion stopper film 97j, eleventh wiring section 114j having a metal barrier layer 86j and tenth wire 88j, and independent wiring section 219j having a metal barrier layer 85j and wire 87j. The tenth and eleventh wiring sections 114i and 114j are formed at predetermined positions so that they are connected to each other.

The passivation films 90 and 91 and high-quality glass substrate or layer 83b are sequentially formed on the upper surface of the copper-diffusion stopper film 97j. In this embodiment, since the third multilayer wiring region 103 is the uppermost layer of the semiconductor device, the passivation films 90 and 91 are provided. Further, the high quality glass layer 83b is attached to increase the mechanical strength of the region 103, as in the second multilayer wiring region 102 shown in FIG. 4. However, since no further wiring layer is attached to the third multilayer wiring region 103, the high quality glass layer 83b may be removed by polishing after the attachment is finished.

The third multilayer wiring region 103, passivation films 90 and 91 and high quality glass layer 83b on the silicon substrate 70b shown in FIG. 5 can be manufactured by known techniques, therefore are not described.

Although copper is used as a conductive material deposited to form each contact, via hole and wiring section shown in FIGS. 1–5, other various conductive materials, such as a composite conductive material containing copper, may be used. Further, in the embodiment, the etch stoppers are formed of, for example, an SiN insulation film, and the copper-diffusion stopper films are formed of, for example, SiN. Furthermore, the interlayer insulation films are formed of, for example, $SiO_2$ containing phosphorus or boron. The interlayer insulation films may be formed of FSG.

In addition, the interlayer insulation films, for example, may have a laminated (multilayer) structure with layers of different materials, instead of the single-layer structure.

As described above, in the embodiment, the first to third multilayer wiring regions 101–103 are formed separately. These multilayer wiring regions 101–103 are attached to each other to form the semiconductor device shown in FIG. 1. Referring now to FIGS. 6A–7B, the manner of attaching the multilayer wiring regions will be described.

Figure 6A:
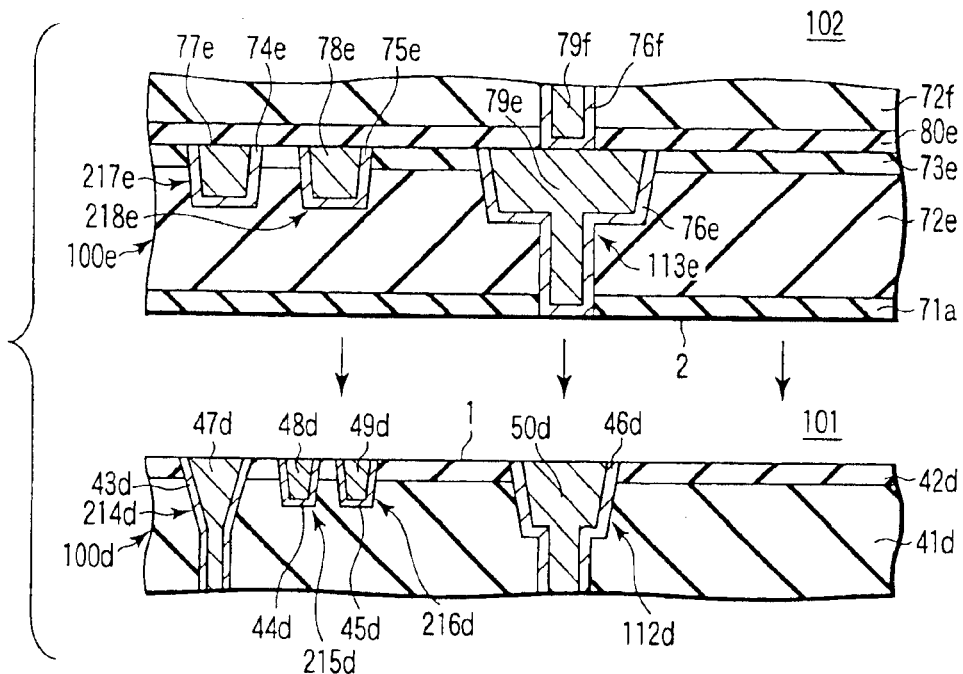
FIG. 6A is a sectional view illustrating, in detail, the attachment surfaces of the first and second multilayer wiring regions, obtained before attachment.

FIG. 6A illustrates a state in which the silicon substrate 70a has been removed after the formation of the second multilayer wiring region 102 and high quality glass substrate or layer 83a, thereby exposing the etch stopper 71a.

FIG. 6A also illustrates the uppermost portion of the multilayer wiring region 101 as the underlayer to be attached to the second multilayer wiring region 102. In this state, the high quality glass layer provided, when necessary, on the first multilayer wiring region 101 is removed, whereby the etch stopper 42d, and the upper surfaces of the fifth wiring section 50d, dependent wiring section 214d and independent wiring sections 215d and 216d are exposed at the same level.

In the figure, the lower surface of the etch stopper 71a, in which the lower surface of the sixth wiring section 113e is exposed, is assumed to be a second attachment surface 2. On the other hand, the upper surface of the etch stopper 42d, in which the fifth wiring section 112d, dependent wiring section 214d and independent wiring sections 215d and 216d are exposed, is assumed to be a first attachment surface 1.

The first and second attachment surfaces 1 and 2 are polished to a mirror finish by, for example, CMP. Alternatively, the attachment surfaces may be first subjected to rough CMP, and then to mirror-finishing CMP using chemicals or a wet process.

Further, the polishing of the silicon substrate 70a shown in FIG. 4 to expose the lower surface of the etch stopper 71a, and the polishing to expose the upper surface of the etch stopper 42d may be performed using a method other than CMP, i.e., for example, etching, if a mirror finish can be realized.

In FIG. 6A, the mirror-finished first and second attachment surfaces 1 and 2 are appropriately positioned and pressed against each other. As a result, they are strongly fixed on each other without any adhesive.

Figure 6B:
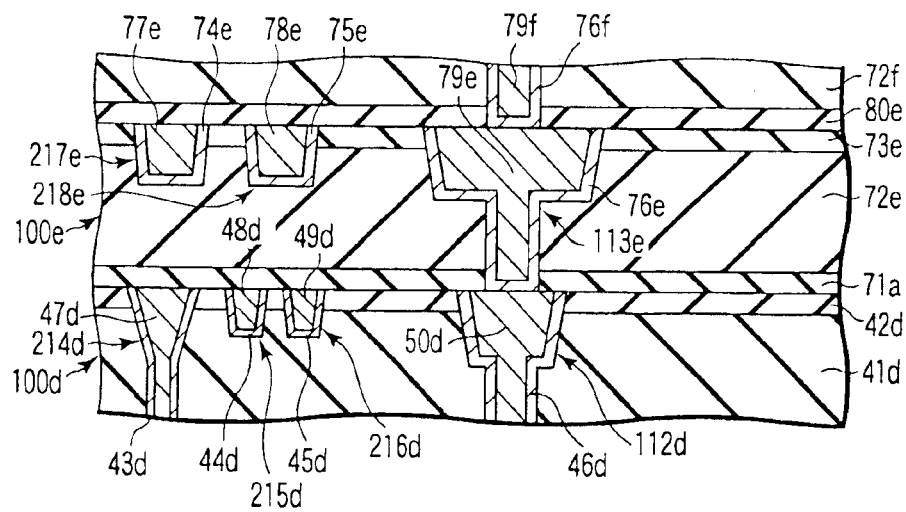
FIG. 6B is a sectional view illustrating, in detail, the attached first and second multilayer wiring regions.
Figure 7A:
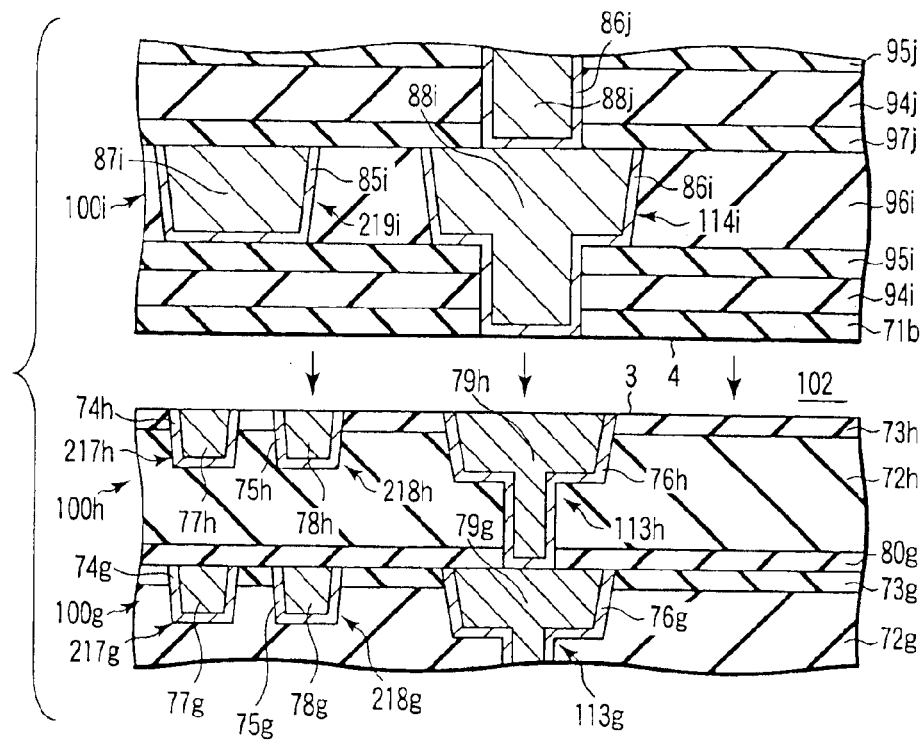
FIG. 7A is a sectional view illustrating, in detail, the attachment surfaces of the second and third multilayer wiring regions, obtained before attachment.
Figure 7B:
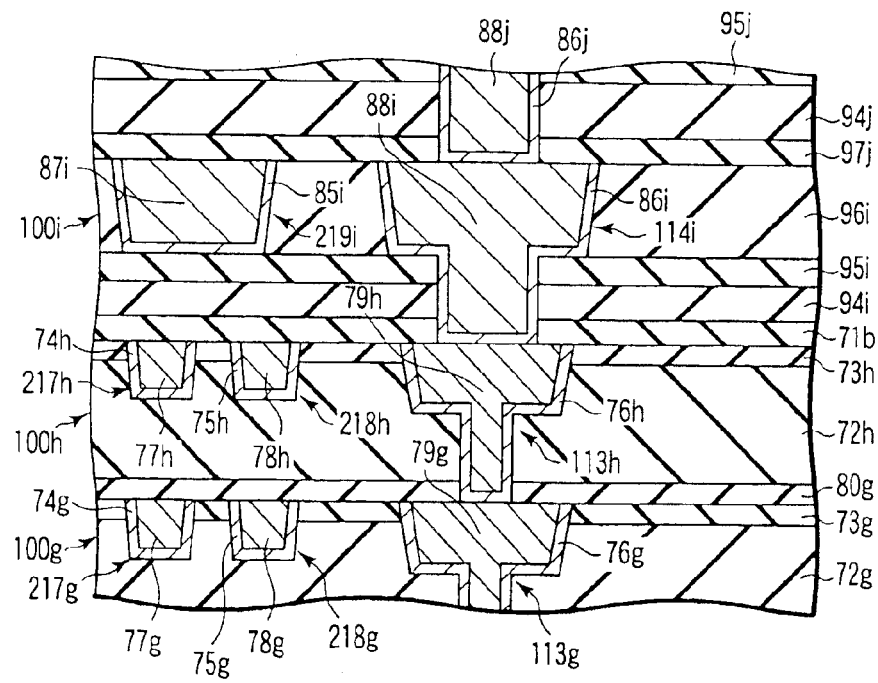
FIG. 7B is a sectional view illustrating, in detail, the attached second and third multilayer wiring regions.

FIG. 6B shows the strongly fixed attachment surfaces. In this case, the attachment surfaces are attached such that the fifth wiring section 112d is connected to the sixth wiring section 113e. Thus, the first multilayer wiring region 101 as the underlayer is attached to the second multilayer wiring region 102 as the first upper structure. Referring to FIGS. 7A and 7B, the process of attaching the resultant structure to the third multilayer wiring region 103 as the second upper structure will be described.

FIG. 7A shows a state in which the high quality glass layer 83a provided on the uppermost layer of the second multilayer wiring region 102 shown in FIG. 4 is removed by polishing, thereby exposing the etch stopper 73h. FIG. 7A also shows a state in which the silicon substrate 70b of the third multilayer wiring region 103 shown in FIG. 5 is removed by polishing, thereby exposing the etch stopper 71b. In the figure, the upper surface of the etch stopper 73h, in which the upper surfaces of the ninth wiring section 113h and wiring sections 217h and 218h are exposed, is assumed to be a third attachment surface 3. On the other hand, the lower surface of the etch stopper 71b, in which the tenth wiring section 114i is exposed, is assumed to be a fourth attachment surface 4.

The high quality glass substrate or layer 83a shown in FIG. 4 and the silicon substrate 70b shown in FIG. 5 can be removed by etching at a predetermined rate, or by means of a CMP method. Further, mirror finishing of the third and fourth attachment surfaces 3 and 4 is performed in the same manner as that of the first and second attachment surfaces 1 and 2.

After mirror-finishing, the third and forth attachment surfaces 3 and 4 are appropriately positioned and pressed against each other, with the result that they are attached strongly as shown in FIG. 7B. In this attached state, the ninth and tenth wiring sections 113h and 114i are connected to each other. Thus, the semiconductor device shown in FIG. 1, having eleven wiring layers 110 and 100a–100j, are completed.

As described above, much time is not needed to prepare the separate multilayer wiring regions 101 to 103 having the first and second mirror-finished attachment surfaces 1 and 2, as well as the third and fourth mirror-finished attachment surfaces 3 and 4 and to attach them as one body. This can significantly reduce the time required to manufacture a multilayered semiconductor device, compared to the prior art.

For example, the attachment technique of this embodiment enabled a trial semiconductor device having a substrate 10 and eleven wiring layers, which is similar to the semiconductor device of FIG. 1, to be produced in about 40 days. Specifically, about 20 days were needed to form the first wiring layer 110 as an underlayer wiring layer on the substrate 10, and about 20 days were needed to form the four wiring layers 100a–100d on the layer 110 (i.e., about 5 days per one wiring layer). Therefore, about 40 days were needed to form the underlayer 101.

Similarly, about 20 days were needed to produce the second multilayer wiring region 102 that has four wiring layers. Further, about 10 days were needed to form the third multilayer wiring region 103 that has two wiring layers. Therefore, if production of the three regions 101–103 is simultaneously started, the entire semiconductor device can be manufactured in about 40 days, since little time is needed to attach the regions.

On the other hand, in the conventional technique, about 20 days are needed to produce the underlayer having the first wiring layer 110, and about 50 days are needed to form ten wiring layers 100a–100h on the underlayer (about 5 days are needed to form each wiring layer). In total, about 70 days are needed.

It is understood from the above that the method of the invention can reduce the manufacturing time by about 30 days.

If the method of the invention is applied to a semiconductor device in which 20 days are needed to produce an underlayer having a first wiring layer 110, and 50 days are needed to produce an upper structure having ten wiring layers, the entire semiconductor device can be manufactured in 50 days. On the other hand, if the conventional method is employed, 70 days are needed, which is about 1.4 times longer than needed in the present invention.

Further, if the semiconductor device of FIG. 1 is divided into an underlayer having one wiring layer, and two upper structures each having five wiring layers, and the underlayer and upper structures are manufactured separately, the entire device can be manufactured in only 25 days (since 20 days are needed for the underlayer, and 25 days are needed for each upper structure). In this case, if the conventional method is used, 70 days are needed, which is about 2.8 times longer than needed in the present invention.

The attachment method of the present invention is effective even when at least two multilayer wiring regions (structures) are attached to each other. In the embodiment, the first to fourth attachment surfaces 1–4 are attached to each other, with the metal surfaces of, for example, the wiring layers exposed in the etch stopper surface that is formed of, for example, an SiN insulation film. It was found from the experiments that if 40% or more of each attachment surface is a metal, they could be attached appropriately. Under this condition, reliable attachment is realized.

Further, as shown in FIGS. 1–6B, the first to eleventh wiring sections 111, 112a–112d, 113e–113h, 114i, and 114j connected to each other on the semiconductor substrate 10 are constructed such that the higher the position, the thicker. This is because it is necessary to form the wiring sections such that the higher the position, the lower the resistance. Forming the upper wiring sections thicker also serves to increase the ratio of the metal portion in each attachment surface, thereby further increasing the rigidity of attachment.

Furthermore, in the embodiment of FIG. 1, when the multilayer wiring region 101 as the underlayer has been formed, it should be checked, before attachment, whether or not this region is formed as designed. Similarly, when the first and second upper structures 102 and 103 have been formed, it should be checked, before attachment, whether or not these regions are formed as designed. If, for example, only the region 103 is determined to be defective, it is sufficient if only this region is re-produced, and hence only about ten days are further needed.

On the other hand, in the conventional method in which a number of wiring layers are sequentially formed on a semiconductor substrate, when a portion corresponding to the region 103 has been determined to be defective, more than 60 days have already passed since the start of the manufacturing, i.e., more than 80% of the device has been completed. At this stage, the device must be re-produced from the beginning.

In addition, in the embodiment, wiring layers themselves are exposed through each attachment surface, and the exposed wiring layers are directly attached to each other, thereby forming a multilayered semiconductor device. However, the invention is not limited to this. If a metal of a large area is connected to each to-be-attached wiring layer, and the resultant structures are attached to each other, the contacts of the wiring layers can be positioned more easily and reliably.

FIGS. 8A–10C are sectional views illustrating an embodiment based on this idea. A description will be given of the embodiment, taking, as an example, the case where the second and third multilayer wiring regions 102 and 103 as shown in FIG. 1 are prepared separately. It is a matter of course that the same advantage can be obtained if the first and second multilayer wiring regions 101 and 102 are attached.

Firstly, as shown in FIG. 5, the third multilayer wiring region 103 is formed on the silicon substrate 70b. Subsequently, the substrate 70b and etch stopper 71b are polished. Further, the entire etch stopper 71b and the bottom surface of the metal barrier layer 86i are polished so that the lower portion of the tenth wire 88i of the tenth wiring section 114i is exposed. In this case, polishing is finished when the entire etch stopper 71b has been removed.

Figure 8A:
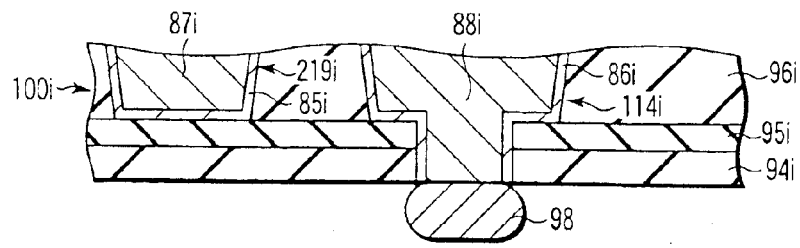
FIG. 8A is a sectional view useful in explaining the step of providing a solder ball on the attachment portion of the third multilayer wiring region of a semiconductor device according to another embodiment.

After that, the surfaces of the tenth wire 88i and metal barrier layer 86i exposed through and level with the lower surface of the interlayer insulation film 94i are dipped into melted solder and raised therefrom. As a result, an elliptic solder ball 98 is attached to the lower surface of the tenth wire 114i as shown in FIG. 8A.

Figure 8B:
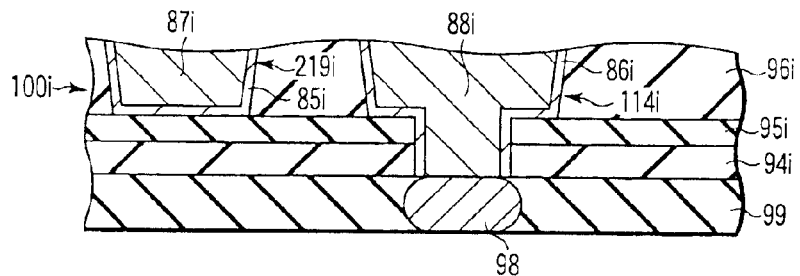
FIG. 8B is a sectional view useful in explaining the step, next to the step of FIG. 8A, of covering the solder ball with an interlayer insulation film.

Thereafter, as shown in FIG. 8B, an interlayer insulation film 99 is formed on the interlayer insulation film 94i such that it covers the solder ball 98.

Figure 8C:
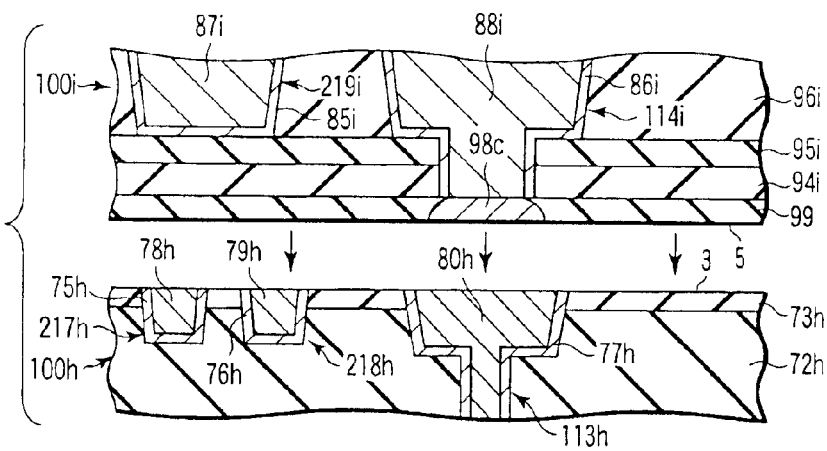
FIG. 8C is a sectional view useful in explaining the step, next to the step of FIG. 8B, of attaching the attachment surfaces of the second and third multilayer wiring regions of the semiconductor device.

Thereafter, as shown in FIG. 8C, the solder ball 98 and interlayer insulation film 99 are polished by, for example, CMP to the extent that the maximum sectional area, along the major axis, of the solder ball 98 to be attached to the second multilayer wiring region 102 is exposed. The resultant attachment surface is further polished to a mirror finish by, for example, CMP.

As a result, an attachment surface 5 is formed which comprises a semi-spherical solder contact 98c forming a predetermined micro-bump contact, and the lower surface of the interlayer insulation film 99 level with the lower surface of the contact.

On the other hand, the high quality glass substrate 83 formed as the uppermost layer of the second multilayer wiring region 102 shown in FIG. 4 is polished to a mirror finish. As a result, the second multilayer wiring region 102, which has the attachment surface 3 formed of the etch stopper 73h and the ninth wiring section 113h and wiring sections 217h and 218h exposed in the stopper 73h, is prepared as shown in FIG. 8C.

Figure 8D:
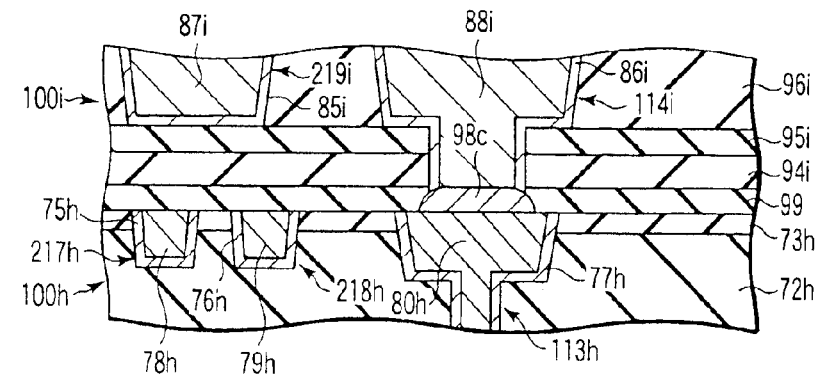
FIG. 8D is a sectional view illustrating the structure resulting from the attachment step shown in FIG. 8C.

The mirror-finished attachment surfaces 3 and 5 are appropriately positioned and pressed against each other, with the result that they are attached to each other. FIG. 8D shows the attachment result. As shown, the ninth and tenth wiring sections 113h and 114i are electrically connected via the solder contact 98c.

Since, thus, the solder contact 98c formed as the micro-bump contact is provided on the lower surface of the wiring section 114i, the positioning tolerance is large and the attachment can be performed more reliably than in the embodiment of FIG. 1.

In the above embodiment, the solder contact 98c formed as the micro-bump contact increases the attachment area of the tenth wiring section 114i, thereby enabling reliable attachment. However, reliable attachment can be realized by increasing the size of the via portion (the lower small-diameter portion) of the tenth wiring section 114i, instead of using the solder contact 98c.

Furthermore, in the above embodiment, the attachment area of the wiring section 114i is increased by forming the solder contact 98c on the via portion of the section 114i. Alternatively, the attachment area may be increased by a wiring section, corresponding to the solder contact 98c, which is pre-formed in the portion of the silicon substrate 70b that is aligned with the via portion of the wiring section 114i.

Figure 9A:
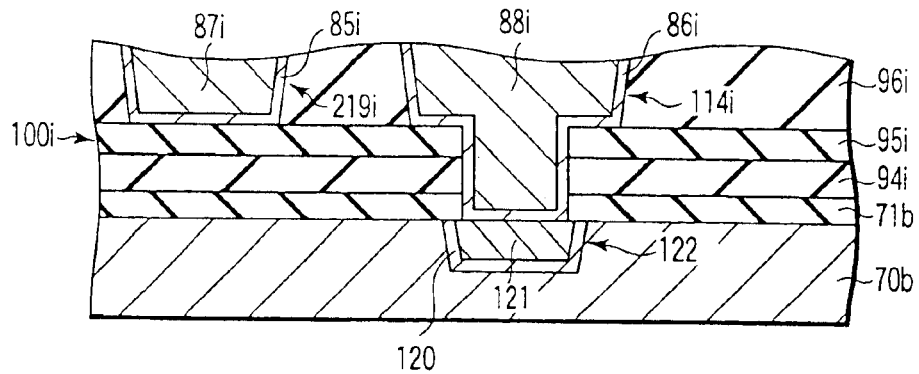
FIG. 9A is a sectional view illustrating a wiring section formed in a silicon substrate according to yet another embodiment, the wiring section being used as the attachment portion of the third multilayer wiring region of the semiconductor device.
Figure 9B:
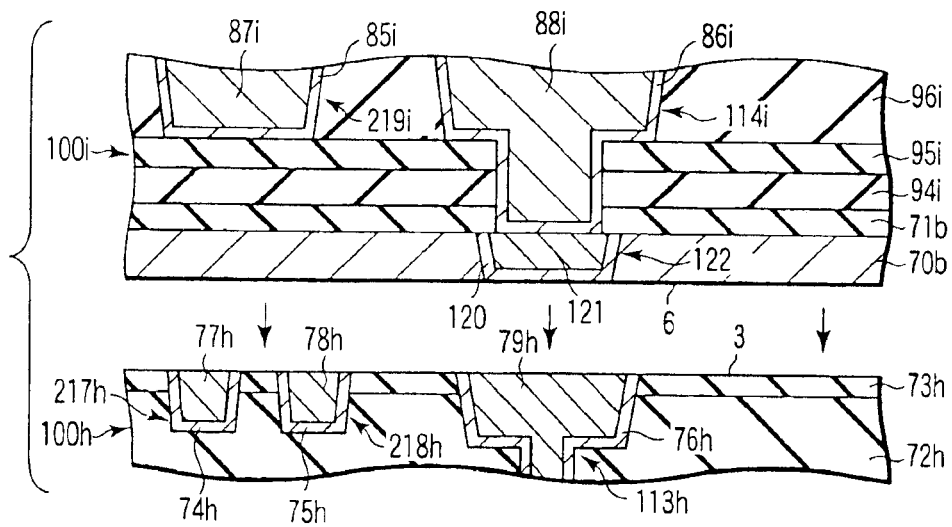
FIG. 9B is a sectional view useful in explaining the step of attaching the attachment surfaces of the second and third multilayer wiring regions of the semiconductor device shown in FIG. 9A.
Figure 9C:
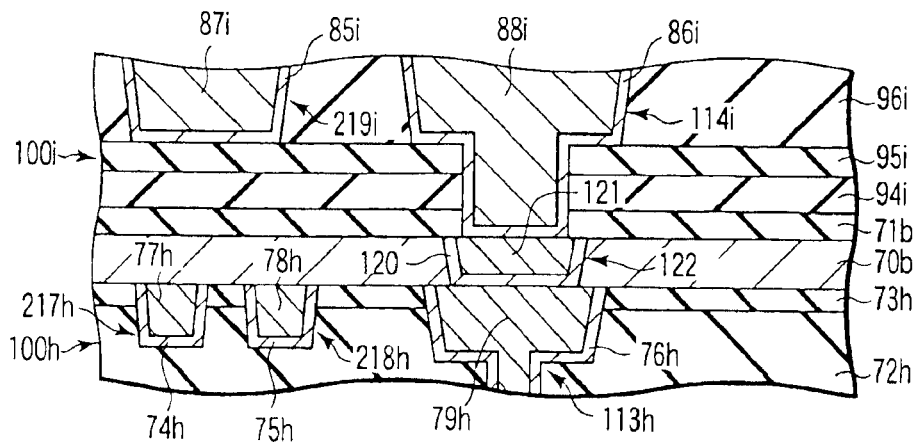
FIG. 9C is a sectional view illustrating the structure resulting from the attachment step shown in FIG. 9B.

FIGS. 9A–9C are sectional views illustrating the alternative case. In this case, a wiring section 122 is formed in the surface of the silicon substrate 70b just below the wiring section 114i as shown in FIG. 9A, thereby increasing the attachment area. In this embodiment, elements similar to those of the above embodiment are denoted by corresponding reference numerals, and no detailed description is given thereof.

Firstly, as shown in FIG. 9A, a wiring trench is formed in the silicon substrate 70b, and is then filled with a wiring section 122 having a metal barrier layer 120 and copper wiring section 121.

After the wiring section 122 is formed, the surface of the resultant structure is flattened by CMP, and the third multilayer wiring region 103 is formed thereon by the same process as that employed to form the structure of FIG. 5.

Subsequently, as shown in FIG. 9B, the silicon substrate 70b is etched by, for example, CMP until the lower surface of the metal barrier layer 120 of the wiring section 122 is exposed. After that, the exposed surface of the metal barrier layer 120 and the etched surface of the silicon substrate 70b are polished to a mirror finish by CMP, thereby forming an attachment surface 6. FIG. 9B shows the mirror-finished attachment surface 6 and the upper surface, as the attachment surface 3, of the second multilayer wiring region 102.

Thereafter, as shown in FIG. 9C, the attachment surfaces 3 and 6 are appropriately positioned and pressed against each other, whereby they are attached. In this state, the ninth wiring section 113h of the second multilayer wiring region 102 is connected to the tenth wiring section 114i of the third multilayer wiring region 103 via the wiring section 122. As described above, since the wiring section 122, which provides a larger attachment area than the via portion of the wiring section 114i, is formed on the via portion, the attachment can be performed further reliably.

Figure 10A:
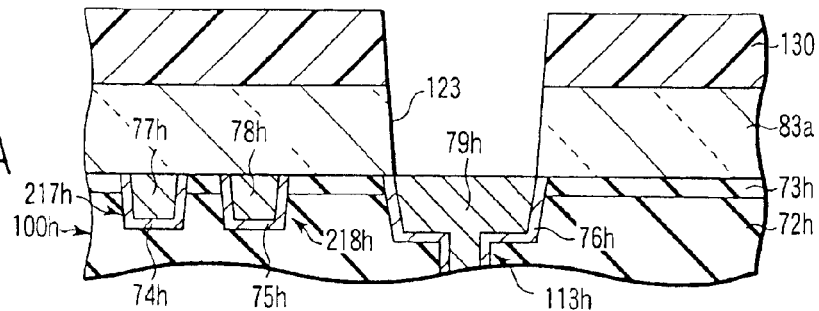
FIG. 10A is a sectional view useful in explaining the step of forming a wiring section in high quality glass substrate having the attachment surface of the second multilayer wiring region of a semiconductor device according to a further embodiment.
Figure 10B:
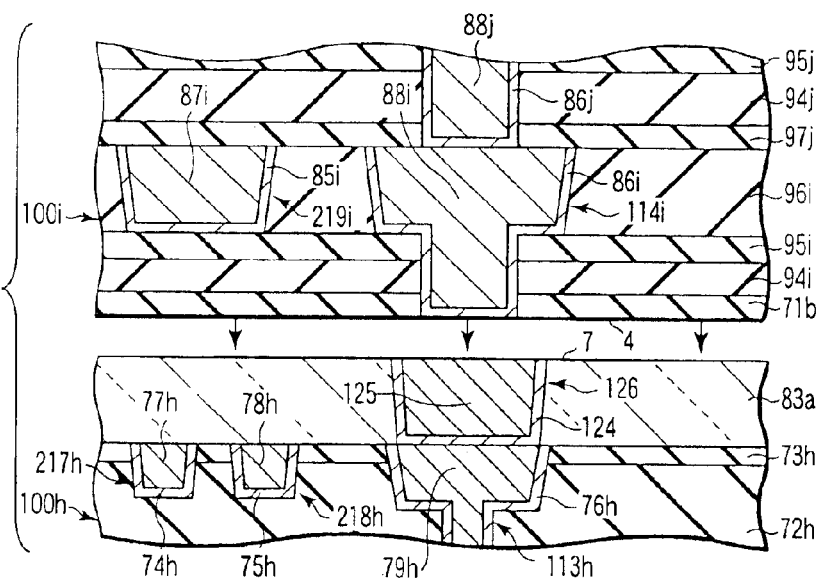
FIG. 10B is a sectional view useful in explaining the step, next to the step of FIG. 10A, of attaching the attachment surfaces of the second and third multilayer wiring regions of the semiconductor device.
Figure 10C:
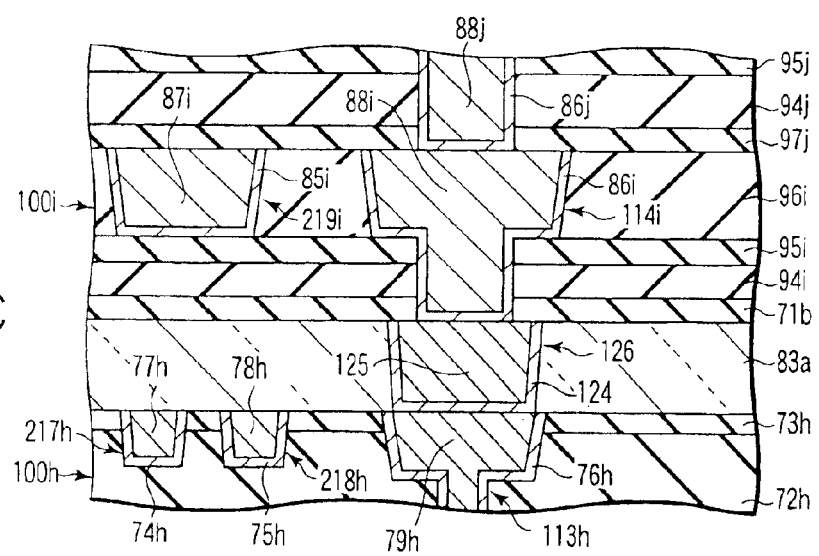
FIG. 10C is a sectional view illustrating the structure resulting from the attachment step shown in FIG. 10B using wirings formed in the high quality glass substrate.

Referring to FIGS. 10A–10C, yet another embodiment will be described. In this embodiment, the high quality glass substrate 83a shown in FIG. 4 has the function of preventing diffusion of copper. In the embodiment shown in FIGS. 9A–9C, the high quality glass substrate 83a is completely removed to expose the etch stopper 73h. On the other hand, in the embodiment shown in FIGS. 10A–10C, the high quality glass substrate 83a is not removed, instead, a wiring section 125 is formed in the glass substrate such that it is connected to the ninth wiring section 113h as shown in FIG. 10B. In this embodiment, elements similar to those of the above-described embodiments are denoted by corresponding reference numerals, and no detailed description is given thereof.

Firstly, as shown in FIG. 10A, a predetermined resist pattern 130 is formed, by standard photolithography, on the high quality glass substrate 83a that is provided on the second multilayer wiring region 102 of FIG. 4.

After forming the resist pattern 130, the high quality glass substrate 83a is etched using the resist pattern 130 as a mask, thereby exposing the upper surface of the wiring section 79h of the ninth wiring section 113h. Thus, a wiring trench 123 is formed in the high quality glass substrate 83a on the wiring section 79h as shown in FIG. 10A.

After forming the wiring trench 123, the resist pattern 130 is removed, and a wiring section 126 having a metal battier layer 124 and copper wire 125 is formed in the wiring trench 123 as shown in FIG. 10B. Thereafter, the upper surfaces of the wiring section 126 and high quality glass substrate 83a are polished to a mirror finish by CMP, thereby providing an attachment surface 7. FIG. 10B shows the mirror-finished attachment surface 7 and the lower surface, as the attachment surface 4, of the third multilayer wiring region 103.

Subsequently, as shown in FIG. 10C, the attachment surfaces 4 and 7 are appropriately positioned and pressed against each other, whereby they are attached. In this state, the ninth wiring section 113h is connected to the tenth wiring section 114i of the third multilayer wiring region 103 via the wiring section 126 having a large area.

As described above, if the high quality glass substrate 83a has the function of preventing diffusion of copper, it may be left, and the wiring section 126, which is to be connected to the wiring section located above, e.g. the tenth wiring section 114i, may be formed in the glass substrate. This structure can realize a strong attachment and enhanced conductivity. Further, the structure has an increased mechanical strength since the high quality glass substrate is not removed. Therefore, the second multilayer wiring region 102 can be easily handled when it is attached.

As described above, copper wires or wires containing copper are used as the wiring of the semiconductor device. In particular, when copper wires or copper containing wires are used, it is necessary to form a copper diffusion stopper film in a wiring layer adjacent to the wire.

Pay attention to, for example, the attached portions of the fifth and sixth wiring layers 100d and 100e shown in FIG. 6B. In this case, no particular copper diffusion stopper film is formed between the fifth and sixth wiring sections 112d and 113e, but the etch stopper 71a, for example, may be also used as a copper diffusion stopper film.

It is a matter of course that a copper diffusion stopper film, if necessary, may be formed between the fifth and sixth wiring sections 112d and 113e. For example, a copper diffusion stopper film may be formed on the attachment surface 1, shown in FIG. 6A, obtained by removing the high quality glass substrate 83c on the fifth wiring layer 100d. In this case, it is necessary to form a contact hole in the copper diffusion stopper film serving as an insulation film, and to fill the contact hole with a conductive material, thereby forming a contact for connecting the fifth wiring section 112*d* to the sixth wiring section 113*e* when the regions 101 and 102 are attached. The upper surfaces of the contact and copper diffusion stopper film are polished to a mirror finish by CMP, thereby forming an attachment surface.

When the ratio of the total metal area to the insulation area is 40% or more in the attachment surfaces 1–7, reliable attachment is possible. However, the ratio may be less than 40% depending upon conditions.

The invention is not limited to the above-described embodiments, but may be modified in various ways without departing from the scope.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device having a number of wiring layers, comprising:
   forming an underlayer, the underlayer including a substrate, at least one underlayer wiring layer having a wire portion formed in an upper wiring trench and a plug portion formed in a lower via hole continuous with the upper wiring trench formed in an interlayer insulation film provided on the substrate, and a first attachment surface in which an upper surface of the wire portion of the underlayer wiring layer is exposed;
   forming at least one upper structure, the upper structure including at least one upper wiring layer having a wire portion formed in an upper wiring trench and a plug portion formed in a lower via hole continuous with the upper wiring trench formed in an interlayer insulation film and a second attachment surface in which a lower surface of the plug portion of the upper wiring layer is exposed; and
   linearly arranging the exposed lower surface of the plug portion of the upper structure and the exposed upper surface of the wire portion of the underlayer and attaching the first and second attachment surfaces to each other.

2. A method according to claim 1, wherein part of the underlayer wiring layer and part of the upper wiring layer are polished to a mirror finish and exposed through the first and second attachment surfaces, respectively.

3. A method according to claim 2, wherein the underlayer wiring layer and the upper wiring layer are formed of copper.

4. A method according to claim 2, wherein the first and second attachment surfaces are attached by pressing.

5. A method according to claim 2, wherein a solder bump contact is formed on the second attachment surface.

6. A method according to claim 2, wherein a wiring section is formed on a predetermined portion of the second attachment surface.

7. A method according to claim 2, wherein the upper structure has an upper wiring layer formed on a predetermined reinforcing member, and the second attachment surface is formed by polishing the reinforcing member.

8. A method according to claim 7, wherein the reinforcing member has a conductive section at a predetermined position, the conductive section being exposed by the polishing.

9. A method according to claim 7, wherein an upper surface of the upper structure is coated with a protection film.

10. A method according to claim 1, wherein the underlayer wiring layer and the upper wiring layer are formed of copper.

11. A method according to claim 1, wherein the first and second attachment surfaces are attached by pressing.

12. A semiconductor device having a number of wiring layers, comprising:
   an underlayer including a substrate, at least one underlayer wiring layer having a wire portion formed in an upper wiring trench and a plug portion formed in a lower via hole continuous with the upper wiring trench formed in an interlayer insulation film provided on the substrate, and a first attachment surface in which an upper surface of the wire portion of the upper wiring layer is exposed; and
   at least one upper structure including at least one upper wiring layer having a wire portion formed in an upper wiring trench and a plug portion formed in a lower via hole continuous with the upper wiring trench formed in an interlayer insulation film and a second attachment surface in which is exposed a lower surface of the plug portion of the upper wiring layer which is attached to the upper surface the wire portion of the underlayer wiring layer of the first attachment surface.

13. A semiconductor device according to claim 12, wherein part of the underlayer wiring layer and part of the upper wiring layer are polished to a mirror finish, exposed through the first and second attachment surfaces, respectively, and attached to each other.

14. A semiconductor device according to claim 13, wherein not less than 40% of each of the first and second attachment surfaces is a metal.

15. A semiconductor device according to claim 12, wherein the underlayer wiring layer and the upper wiring layer are formed of copper.

16. A semiconductor device according to claim 15, further comprising a diffusion stopper film formed along surfaces of the underlayer wiring layer and the upper wiring layer, the diffusion stopper film preventing diffusion of copper contained in the underlayer wiring layer and the upper wiring layer.

17. A semiconductor device according to claim 16, wherein not less than 40% of each of the first and second attachment surfaces is a metal.

18. A semiconductor device according to claim 15, wherein not less than 40% of each of the first and second attachment surfaces is a metal.

19. A semiconductor device according to claim 12, wherein the second attachment surface has a solder bump contact on a predetermined portion thereof.

20. A semiconductor device according to claim 19, wherein not less than 40% of each of the first and second attachment surfaces is a metal.

21. A semiconductor device according to claim 12, wherein the second attachment surface has a wiring section on a predetermined portion thereof.

22. A semiconductor device according to claim 21, wherein not less than 40% of each of the first and second attachment surfaces is a metal.

23. A semiconductor device according to claim 12, wherein the upper structure has a predetermined reinforcing member and an upper wiring layer formed on the reinforcing member, the reinforcing member having a conductive section formed at a predetermined position, the conductive section being exposed through the second attachment surface.

24. A semiconductor device according to claim 23, wherein an upper surface of the upper structure is coated with a protection film.

25. A semiconductor device according to claim 24, wherein not less than 40% of each of the first and second attachment surfaces is a metal.

26. A semiconductor device according to claim 23, wherein not less than 40% of each of the first and second attachment surfaces is a metal.

27. A semiconductor device according to claim 12, wherein not less than 40% of each of the first and second attachment surfaces is a metal.

28. A semiconductor device according to claim 12, wherein the wire portion of the upper structure is thicker than the wire portion of the underlayer.

* * * * *